(12) United States Patent
Yannou et al.

(10) Patent No.: US 7,519,496 B2
(45) Date of Patent: Apr. 14, 2009

(54) ELECTRONIC CIRCUIT COMPRISING A SECRET SUB-MODULE

(75) Inventors: Jean-Marc Yannou, Colomby sur Thaon (FR); Hervé Fleury, Caen (FR); Hervé Vincent, Caen (FR)

(73) Assignee: NXP B.V., Eindhoven (NL)

( * ) Notice: Subject to any disclaimer, the term of this patent is extended or adjusted under 35 U.S.C. 154(b) by 26 days.

(21) Appl. No.: 10/571,834

(22) PCT Filed: Sep. 10, 2004

(86) PCT No.: PCT/IB2004/002988

§ 371 (c)(1),
(2), (4) Date: Mar. 15, 2006

(87) PCT Pub. No.: WO2005/029105

PCT Pub. Date: Mar. 31, 2005

(65) Prior Publication Data

US 2007/0088519 A1     Apr. 19, 2007

(30) Foreign Application Priority Data

Sep. 19, 2003  (EP) .................................. 03300125

(51) Int. Cl.
*G01R 31/28* (2006.01)

(52) U.S. Cl. .................. 702/120; 702/117; 713/193; 714/30; 714/728; 714/733

(58) Field of Classification Search ........... 702/57, 702/106, 117, 119, 120; 713/193; 714/726, 714/727, 729, 738, 739, 733, 728
See application file for complete search history.

(56) References Cited

U.S. PATENT DOCUMENTS

| | | | | |
|---|---|---|---|---|
| 4,503,537 A * | 3/1985 | McAnney | ................... | 714/728 |
| 5,357,572 A * | 10/1994 | Bianco et al. | ............... | 713/193 |
| 5,617,531 A * | 4/1997 | Crouch et al. | ................. | 714/30 |
| 5,991,909 A * | 11/1999 | Rajski et al. | ................ | 714/729 |
| 6,601,202 B2 * | 7/2003 | Palm et al. | ................... | 714/726 |
| 6,684,358 B1 * | 1/2004 | Rajski et al. | ................ | 714/739 |
| 6,701,476 B2 * | 3/2004 | Pouya et al. | ................ | 714/727 |
| 6,789,221 B2 * | 9/2004 | Hapke | ........................ | 714/733 |
| 6,922,803 B2 * | 7/2005 | Nakao et al. | ................ | 714/738 |
| 7,085,978 B2 * | 8/2006 | McLaurin et al. | | |
| 2001/0025355 A1* | 9/2001 | Palm et al. | ................... | 714/726 |
| 2002/0069387 A1* | 6/2002 | Hapke | ........................ | 714/733 |

* cited by examiner

*Primary Examiner*—John H Le

(57) ABSTRACT

The invention relates to an electronic circuit including a sub-module assembly (2) connected to the rest of the circuit, the sub-module assembly including a secret sub-module (4) for performing a function, scan chains; a built-in self test circuit including a pattern generator (5) to apply input signals to the scan chains, and a signature register (6) to check output signals from the scan chains. In order to keep the sub-module secret, the scan chains are not connected to the rest of the circuit.

8 Claims, 1 Drawing Sheet

ELECTRONIC CIRCUIT COMPRISING A SECRET SUB-MODULE

FIELD OF THE INVENTION

The present invention is related to electronic circuits, in particular to electronic circuits comprising a secret sub-module.

A sub-module of a digital circuit can contain secret elements such as keys and algorithms. These elements need to be kept secret all along the product life: production, distribution and end use. In particular, testing is a critical step, since conventional test techniques allow external access to the mode of operation of the sub-module. Such conventional techniques include structural scan tests, which allows downloading of all the internal registers of the circuit, and functional application-like tests in which the sub-module receives stimuli such as it would receive during operation, and outputs respective signals which reveal information on the very function of the sub-module by linking the expected output signals to the input signals.

BACKGROUND OF THE INVENTION

Dealing with classical structural scan test, it is to be avoided as it allows for the downloading of all the circuit internal registers. Therefore, using such a technique would allow hackers to access the contents of the secret sub-module. Concerning functional application-like tests, the circuit is being sent stimuli as it would be receiving in its end application. In this case, the test patterns contain information about "how to use the secret module", and about "what are the expected results". Therefore at least part of its secret functionality (the secret keys) is revealed. The test operation is thus not confidential.

US patent application US 2002/0069387 describes a sub-module for example of a low confidentiality level, tested by a deterministic logic built-in self test (DLBIST) circuit. Such self-testing solutions are useful because self-testing the sub-module allows a reduction of the technical requirements necessary for performing external tests on a complex integrated circuit. Yet, when such a circuit is scanned by a conventional structural scan test, information would still be revealed on the nature of the sub-module.

OBJECT AND SUMMARY OF THE INVENTION

An object of the invention is to provide a circuit in which the sub-module is kept at least partly secret during testing.

The invention provides an electronic circuit including a sub-module assembly connected to the rest of the circuit, said sub-module assembly including:
- a sub-module for performing a given function, and comprising at least one scan chain,
- a built-in self test circuit including a pattern generator for applying, in test-mode, input signals to said scan chain, and a signature register for checking output signals from the scan chain, said output signals being generated by the sub-module from the input signals, wherein said scan chain is not connected to the rest of the circuit.

Such self-testing of the sub-module with input signals generated solely by the assembly, whereby output signals are prevented from reaching the rest of the circuit, enables the sub-module to be kept at least partly secret during testing.

This solution is advantageous because deterministic logic BIST techniques are not applied to a complete circuit but only to a sub-block. Moreover, deterministic logic BIST techniques are not used for what there are generally meant, i.e. test cost reduction, but they are used to guarantee a high level of confidentiality around a secret module. It allows this module to be embedded in a broader system-on-chip circuit which can be tested in a usual average security-level environment.

In other words, this cost-effective solution guaranty that the content of the secret sub-block can neither be read out nor directly accessible from outside.

Advantageously, said sub-module includes input pins, said input pins being isolated from the rest of the circuit by isolating cells accessible both by regular scan testing of the rest of the circuit and by self-testing of the sub-module.

These features enable interconnection of the sub-module and the rest of the circuit Advantageously, said isolating cells are adapted to prevent the propagation of unknown values to the signature register.

These features make the generation flow of the built-in self test compatible with the rest of the circuit.

Advantageously, said pattern generator is adapted to provide test patterns to the sub-module not including scan input signals from the rest of the circuit, and wherein said scan output signals are exclusively delivered to the signature analyzer.

Theses features enable self-testing of the sub-module.

Advantageously, said built-in self-test circuit is a deterministic logic built-in self-test circuit, said pattern generator including:
- means for generating pseudo-random test patterns, and
- a bit modifying circuit adapted to convert said pseudo-random test patterns into deterministic test samples.

These features allow a more complete fault coverage.

These and other aspects of the invention will be apparent from and elucidated with reference to the embodiment described hereinafter with reference to the drawing in which:

DESCRIPTION OF PREFERRED EMBODIMENTS

Figure 1:
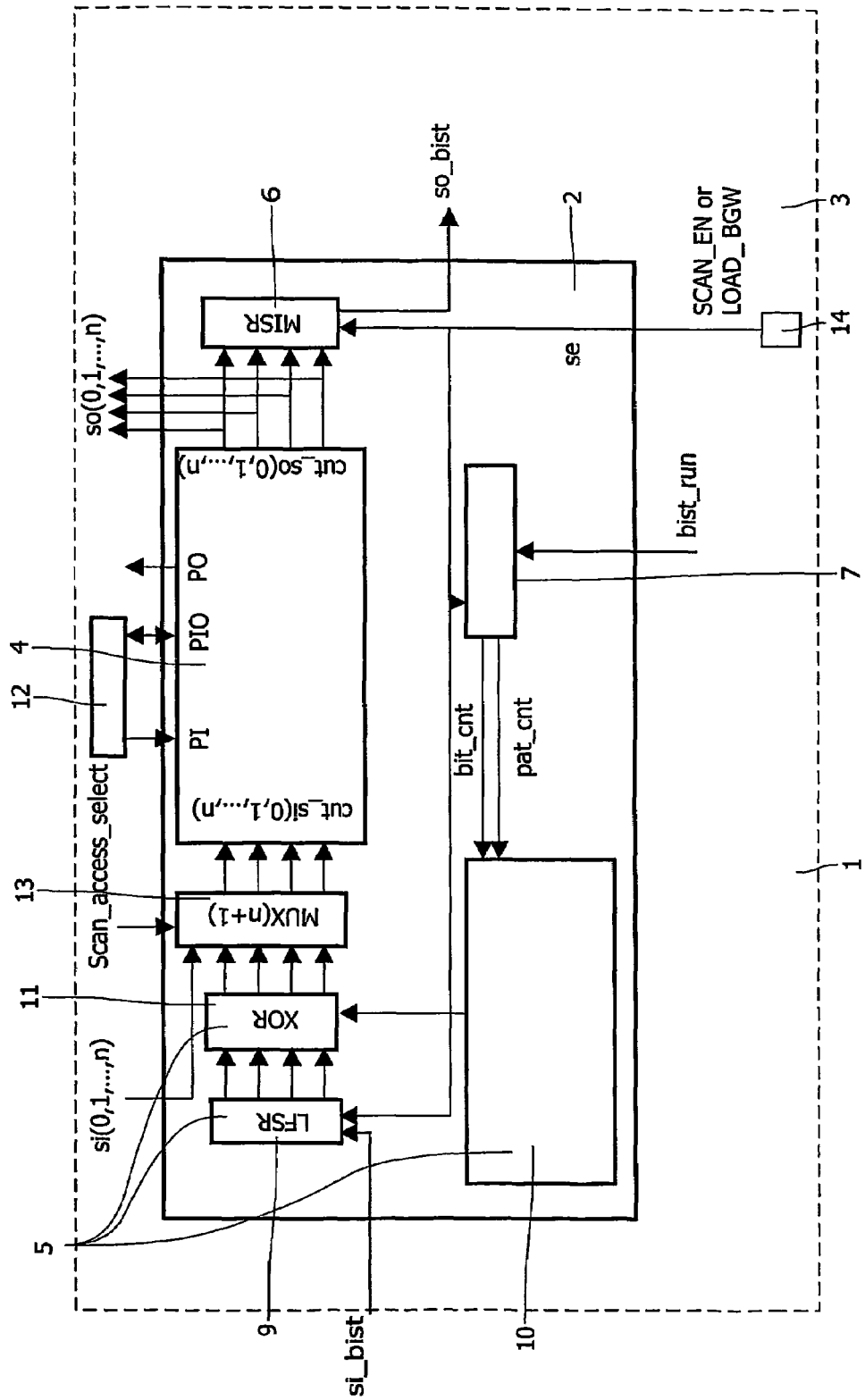
FIG. 1 is a diagrammatic view of the circuit according to the invention.

FIG. 1 represents a schematic view of a circuit 1. The circuit 1 is for example a digital integrated circuit such as a smart card, an audio/video/broadcasting access module, a SIM ("subscriber identity module") card or the like.

The circuit 1 includes a built-in self test and sub-module assembly 2 which incorporates a secret sub-module 4. The rest of the circuit 3 may be of a low-confidentiality level and includes a test control block 14. The built-in self test and sub-module assembly 2 includes the secret sub-module 4 implementing an algorithm in the circuit and interacting with the rest of the circuit by input and output pins PI, PO, PIO. It is important that this algorithm be kept secret during the service life of the circuit, including production, distribution and end use. In particular, during testing, it is to be avoided that the content of the sub-module and its responses to certain input signals can be accessed by any third party.

The assembly 2 includes a built-in self-test (or "BIST") circuit which is represented here as a deterministic logic built-in self-test (or DLBIST) circuit, although any kind of built-in self-test circuit could be used in the scope of the present invention. The deterministic logic built-in self-test circuit includes a pattern generator 5 for generating test patterns to the sub-module, a signature analyzer 6 for checking output signals from the sub-module, and a BIST controller 7 for controlling operation of the BIST.

The pattern generator 5 of the BIST includes a linear feedback shift register (or "LFSR") 9 adapted to apply a pseudo-random sequence of test patterns to the sub-module 4. In addition, the pattern generator 5 can include a bit modification circuit 10, 11 adapted to modify the output of the LFSR 9 to apply deterministic test patterns to the sub-module 4. In the case of a DLBIST, such a bit modification circuit can for example include a bit-flipping function (or "BFF") circuit 10 connected to the LFSR 9 and to a series of logic gates 11, e.g. XOR gates, connected between the output of the LFSR 9 and the input of the sub-module 4. The bit modification circuit 10, 11 modifies the patterns generated by the LFSR 9 at certain bit positions which are selected by both the state of the BIST controller 7 and the state of the LFSR 9 to make them deterministic. The BFF circuit 10 performs an iterative algorithm that enhances the BFF with each iteration in such a way that new deterministic patterns are produced while certain old patterns, sufficient for detecting the already-detected faults, remain unchanged.

In addition to the self-testing of the secret sub-module 4, the circuitry constituting the BIST must also be tested, and may be scanned as it does not contain any secret information. The test control block 14 included in the rest of the circuit 3 provides the LFSR 9, the signature analyzer 6 and the BIST controller 7 with a scan enable signal se which can take the value of a LOAD_BGW signal or a SCAN_EN signal, depending on whether if the sub-module 4 is to be self-tested or if the BIST is to be scanned, respectively.

During self-testing, the test control block sends an LBIST_TEST signal to the bist_run input of the BIST controller 7. The scan enable signal se is then connected to LOAD_BGW, which is set to 1 to initialize the LFSR and the MISR. The sub-module 4 receives test patterns via its scan chains in a test-per-scan way. In conventional techniques, the sub-module 4 under test would receive scan chain input signals cut_si(0,1, . . . ,n) as a multiplexed signal from patterns generated by the pattern generator 5 and an external input signal si(0, 1, . . . ,n) coming from the rest of the chip 3 during global scan testing. In conventional techniques, according to the state of the scan_access_select signal, the multiplexer 13 provides the sub-module 4 with either external input signal si(0,1, . . . ,n) when performing a scan test for the whole circuit 1, or from outputs of pattern generator 5 when self-testing.

According to the invention, the multiplexer 13 (and accordingly the scan chains of the sub-module 4) is not connected to receive that external input signal si(0,1, . . . ,n). This could be obtained by also connecting the scan_access_select signal to LBIST_TEST. Scan chain input signals cut_si(0,1, . . . ,n) are provided by the sole pattern generator 5. If some scan chains of the sub-module 4 are not secret, they could of course be left connected in the conventional way.

Once both the LFSR 9 and the signature analyzer 6 have been initialized, the test control block toggles signal LOAD_BGW from 1 to 0 and the BIST controller 7 then takes control of the subsequent operations. The BIST runs for a suitable number of cycles to test the secret sub-module 4.

From scan chains input signals cut_si(0,1, . . . ,n), the sub-module 4 delivers scan chain output signals cut_so(0, 1, . . . ,n) to the signature analyzer 6. According to the invention, the scan chains of the sub-module 4 are not connected to the rest of the circuit 3; unlike the usual implementation, output signals so(0,1, . . . ,n) are not transmitted to the rest of the circuit 3 and are solely transmitted to the signature analyzer 6 for evaluation of the response. The signature analyzer 6 is for example a Multiple-Input Signal Register (or "MISR") which supplies a signature having a given predetermined value if the sub-module is operated without disturbances. When appropriate, a pattern counter pat_cnt finalizes the test and LOAD_BGW can be switched back anytime to 1 by the test control block 14 to shift the signature out of the MISR. In case of disturbance, this value is output to the rest of the circuit 3 as a so_bist signal that does not reveal anything of the structure or functions of the sub-module 4.

By disconnecting the scan chains of the sub-module 4 from the rest of the circuit 3, the sub-module 4 is made neither read-accessible nor write-accessible in any other test mode than its dedicated DLBIST mode. It therefore remains secret even during testing.

The generation flow of the BIST is made compatible with the rest of the circuit 3 in such a way that no unknown value can be propagated to the signature analyzer 6. This can for example be performed by a masking logic element which, during testing, blocks bits of the sub-module output signals that have undefined states from reaching the MISR. This can be performed by adding, on the input pins PI and PIO of the sub-module 4, an isolation cell 12 such as developed by the Core Test Action Group (CTAG). These isolation cells form surround scan chains. They are transparent to the circuit 1 in operation mode, include a scannable flip-flop to give access to the sub-module, and enable an easy interconnect test between the rest of the circuit and the sub-module.

As stated above, the circuitry constituting the DLBIST and the surround scan chains must also be tested, and may be scanned as it does not contain any secret information. To do so, a SCAN_EN signal is fed to pattern generator 5, signature analyzer 6 and BIST controller 7 from the test control block 14 to enable scanning of the DLBIST. Then, an input BIST scan chain si_bist is input to the LFSR 9, and a corresponding output BIST scan chain so_bist is read from the MISR 6.

The surround scan chains provided by the isolation cells are thus the only chains which are accessible in both normal scan test mode when testing the rest of the circuit and DLBIST mode when testing the sub-module 4 only.

With a light design overhead necessary to install a DLBIST around the sub-module 4 one keeps the sub-module 4 secret throughout the life of the product.

This solution may be applied to any digital integrated circuit which includes a secret module such as smart cards, audio/video/broadcasting access modules, or SIM cards.

Use of the verb "comprise" and its conjugations does not exclude the presence of elements or steps other than those stated in the claims. Use of the article "a" or "an" preceding an element or step does not exclude the presence of a plurality of such elements or steps.

The invention claimed is:

1. An electronic circuit including a sub-module assembly connected to the rest of the circuit, said sub-module assembly including: a sub-module for performing a given function, and comprising at least one scan chain, wherein said sub-module includes input pins, said input pins being isolated from the rest of the circuit by isolating cells accessible both by regular scan testing of the rest of the circuit and by self-testing of the sub-module, a built-in self test circuit including a pattern generator for applying, in test-mode, input signals to said scan chain, and a signature register for checking output signals from the scan chain, said output signals being generated by the sub-module from the input signals, wherein said scan chain, during operation thereof, is disconnected from the rest of the circuit, wherein said built-in self-test circuit is a deterministic logic built-in self-test circuit, said pattern generator being configured to generate pseudo-random test patterns, said pattern generator including a bit modifying circuit configured to convert said pseudo-random test patterns into deterministic test samples, wherein said bit modifying circuit includes a bit-flipping function circuit configured to perform an iterative algorithm that enhances said bit-flipping function circuit with each iteration such that new deterministic samples are produced while some old samples, sufficient for detecting the already-detected faults, remain unchanged.

2. An electronic circuit according to claim 1, wherein said isolating cells are configured to prevent the propagation of unknown values to the signature register.

3. An electronic circuit according to claim 1, wherein said pattern generator is configured to provide test patterns to the sub-module not including scan input signals from the rest of the circuit, and wherein said scan output signals are exclusively delivered to the signature analyzer.

4. An electronic circuit according to claim 1, wherein said sub-module assembly includes a built-in self test circuit controller configured to control operation of said built-in self test circuit, a linear feedback shift register configured to apply a pseudo-random sequence of test patterns to said sub-module, and a multiplexer configured to provide said sub-module with either external input signal when performing a scan test for said electronic circuit or from outputs of said pattern generator when self testing.

5. An electronic circuit according to claim 1, wherein the rest of the circuit includes a test control block configured to initialize said pattern generator and said signature register with a scan enable signal to test said sub-module.

6. An electronic circuit according to claim 5, wherein said test control block is further configured to provide said pattern generator and said signature register with another scan enable signal to enable scanning of said built-in self test circuit.

7. An electronic circuit including a sub-module assembly connected to the rest of the circuit, said sub-module assembly including: a sub-module for performing a given function, and comprising at least one scan chain, a built-in self test circuit including a pattern generator for applying, in test-mode, input signals to said scan chain, and a signature register for checking output signals from the scan chain, said output signals being generated by the sub-module from the input signals, wherein said scan chain, during operation thereof, is disconnected from the rest of the circuit, wherein the rest of the circuit includes a test control block configured to initialize said pattern generator and said signature register with a scan enable signal to test said sub-module.

8. An electronic circuit according to claim 7, wherein said test control block is further configured to provide said pattern generator and said signature register with another scan enable signal to enable scanning of said built-in self test circuit.

* * * * *